(12) United States Patent
Li et al.

(10) Patent No.: US 6,190,925 B1
(45) Date of Patent: Feb. 20, 2001

(54) EPITAXIALLY GROWN LEAD GERMANATE FILM AND DEPOSITION METHOD

(75) Inventors: Tingkai Li; Fengyan Zhang, both of Vancouver; Yoshi Ono; Sheng Teng Hsu, both of Camas, all of WA (US)

(73) Assignee: Sharp Laboratories of America, Inc., Camas, WA (US)

(*) Notice: Under 35 U.S.C. 154(b), the term of this patent shall be extended for 0 days.

(21) Appl. No.: 09/302,272

(22) Filed: Apr. 28, 1999

(51) Int. Cl.[7] ................................................. H01L 21/00
(52) U.S. Cl. ................................................. 438/3; 438/933
(58) Field of Search ........................... 438/3, 933; 365/65

(56) References Cited

U.S. PATENT DOCUMENTS 5,731,608 * 3/1998 Hsu et al. ............................ 257/295

OTHER PUBLICATIONS

Mansigh et al, Flash evaporated Ferroelectric Lead Germanate Films, pp. 359–370, Jan. 1981.*

Iwasake et al, Ferroelectric and optical properties of Pb GeO, pp. 4907–4915, May 1972.*

Article entitled, "Processing of a Uniaxial Ferroelectric $Pb_5Ge_3O_{11}$ Thin Film at 450° C. with C–Axis Orientation", by J.J. Lee and S.K. Dey, published in Appl. Phys. Lett. 60 (2), May 18, 1992, pp. 2487–2488.

Article entitled, "Ferroelectric and Optical Properties of $Pb_5Ge_3O_{11}$ and its Isomorphous Compound $Pb_5Ge_3SiO_{11}$", by H. Iwasaki, S. Miyazawa, H. Koizumi, K. Sugii & N. Niizeki, published in J. Appl. Phys., vol. 43, No. 12, Dec. 1972, pp. 4907–4915.

Article entitled, Electro–optic Properties of Ferroelectric 5PbO—$3GeO_2$ Single Crystal, by N. Uchida, T. Saku, H. Iwasaki & K. Onuki, published in J. Appl. Phys., vol. 43, No. 12, Dec. 1972, pp. 4933–4936.

Article entitled, "Oriented Lead Germanate Thin Films by Excimer Laser Ablation", by C.J. Peng, D. Roy and S.B. Krupanidhi, published in Appl. Phys. Lett. 60 (7), Feb. 17, 1992, pp. 827–829.

Article entitled, Evolution of Ferroelectricity in Ultrafine–grained $Pb_5Ge_3O_{11}$ Crystallized from the Glass, by A.M. Glass, K. Nassau & J.W. Shiever, published in J. Appl. Phys. 48(12) Dec. 1977, pp. 5213–5216.

Article entitled, 5PbO–$3GeO_2$ Crystal; A New Ferroelectric, by H. Iwasaki, K. Sugii, T. Yamada & N. Niizeki, published in Appl. Phys., vol. 18, No. 10, May 15, 1971, pp. 444–445.

Article entitled, Elastic and Piezoelectric Properties of Ferroelectric 5PbO—$3GeO_2$ Crystals, by T. Yamada, H. Iwasaki & N. Niizeki, published in J. Appl. Phys. vol. 43, No. 3, Mar., 1972, pp. 771–775.

Article entitled, Electrical and Structural Properties of Flash–Evaporated Ferroelectric Lead Germanate Films on Silicon, by A. Mansingh & S.B. Krupanidni, published in Thin Solid Films, 80(1981) pp. 359–371 No Month.

Article entitled, Preparation and Properties of Thermally Evaporated Lead Germanate Films, by A. Mansingh & S.B. Krupanidhi, published in J. Appl. Phys. 51(10), Oct. 1980, pp. 5408–5412.

* cited by examiner

Primary Examiner—Richard Booth
Assistant Examiner—Alexander G. Ghyka
(74) Attorney, Agent, or Firm—David C. Ripma; Matthew D. Rabdau

(57) ABSTRACT

The present invention provides a substantially single crystal PGO film with optimal the ferroelectric properties. The PGO film and adjacent electrodes are epitaxially grown to minimize mismatch between the structures. MOCVD deposition methods and RTP annealing procedures permit a PGO film to be epitaxially grown in commercial fabrication processes. These epitaxial ferroelectric have application in FeRAM memory devices. The present invention deposition method epitaxially grows ferroelectric $Pb_5Ge_3O_{11}$ thin films along with c-axis orientation.

17 Claims, 8 Drawing Sheets

Fig. 5 THE X-RAY PATTERN OF THE PARTIAL EPITAXIAL
C-AXIS ORIENTED PGO THIN FILMS
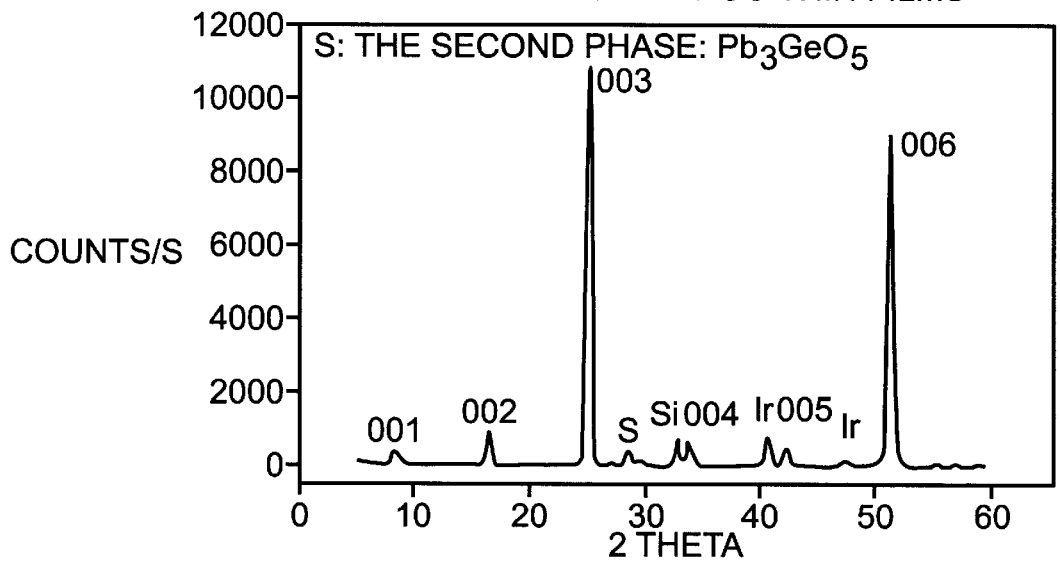
Fig. 6 THE X-RAY PATTERN OF THE TYPICAL EPITAXIAL
C-AXIS ORIENTED PGO THIN FILMS
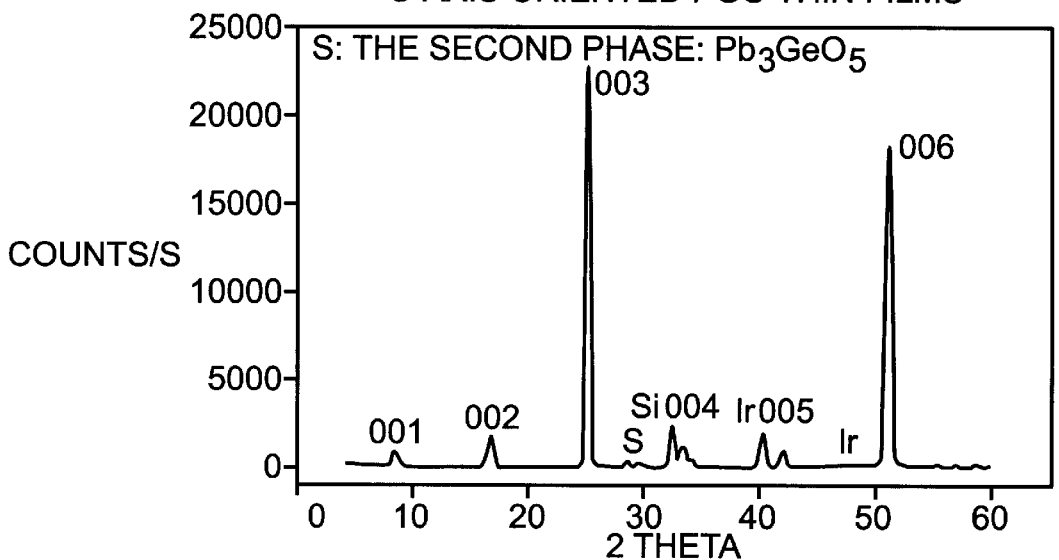

Fig. 7 MICROSTRUCTURE OF THE PARTIAL EPITAXIAL PGO THIN FILMS
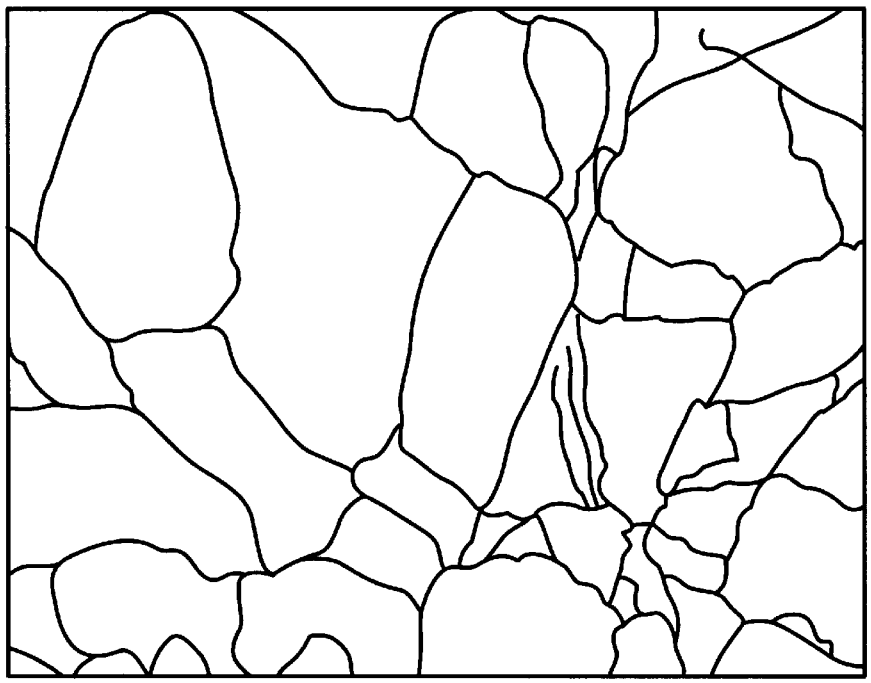
Fig. 8 MICROSTRUCTURE OF THE TYPICAL EPITAXIAL PGO THIN FILMS
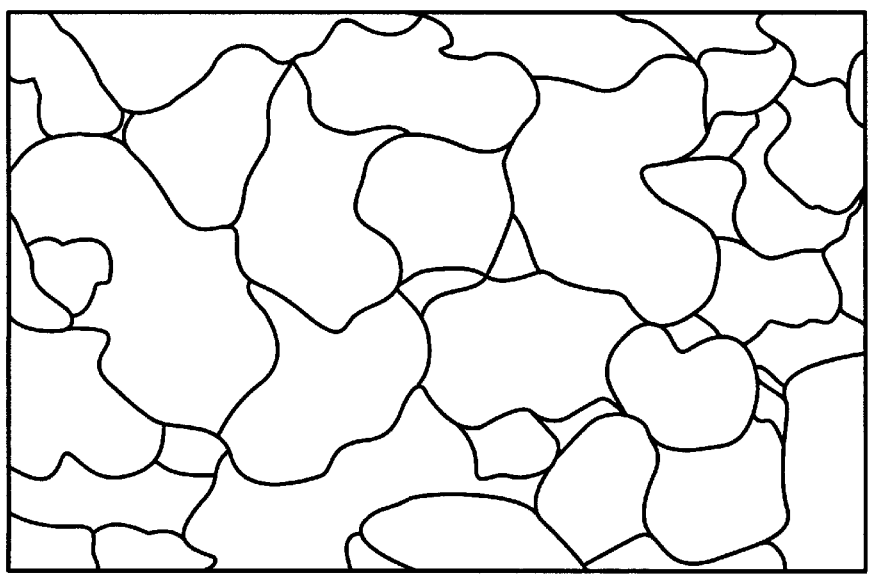

Fig. 10a THE FATIGUE PROPERTIES OF THE PARTIAL EPITAXIAL PGO THIN FILM
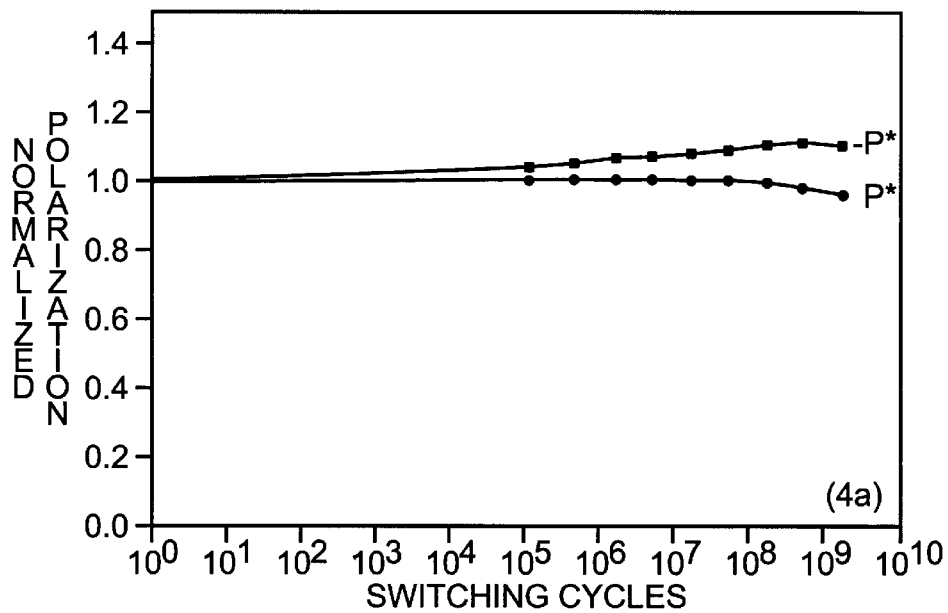
Fig. 10b THE HYSTERESIS LOOPS OF PARTIAL EPITAXIAL PGO FILM BEFORE AND AFTER FATIGUE
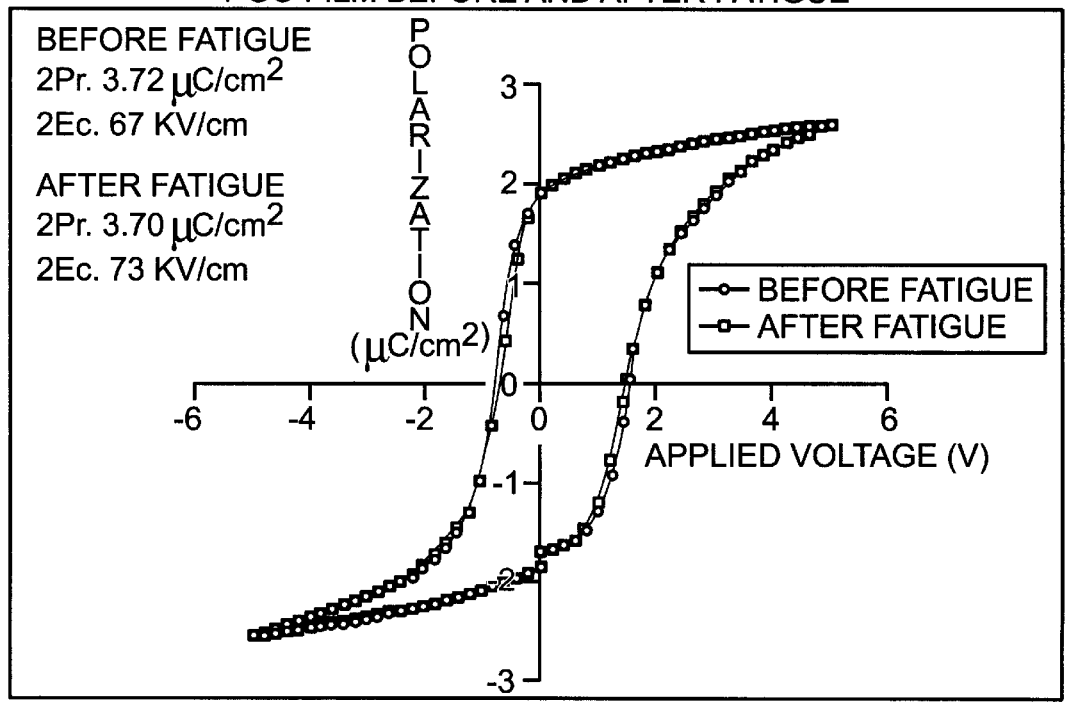

Fig. 13 HYSTERESIS LOOP OF EPITAXIAL PGO THIN FILMS
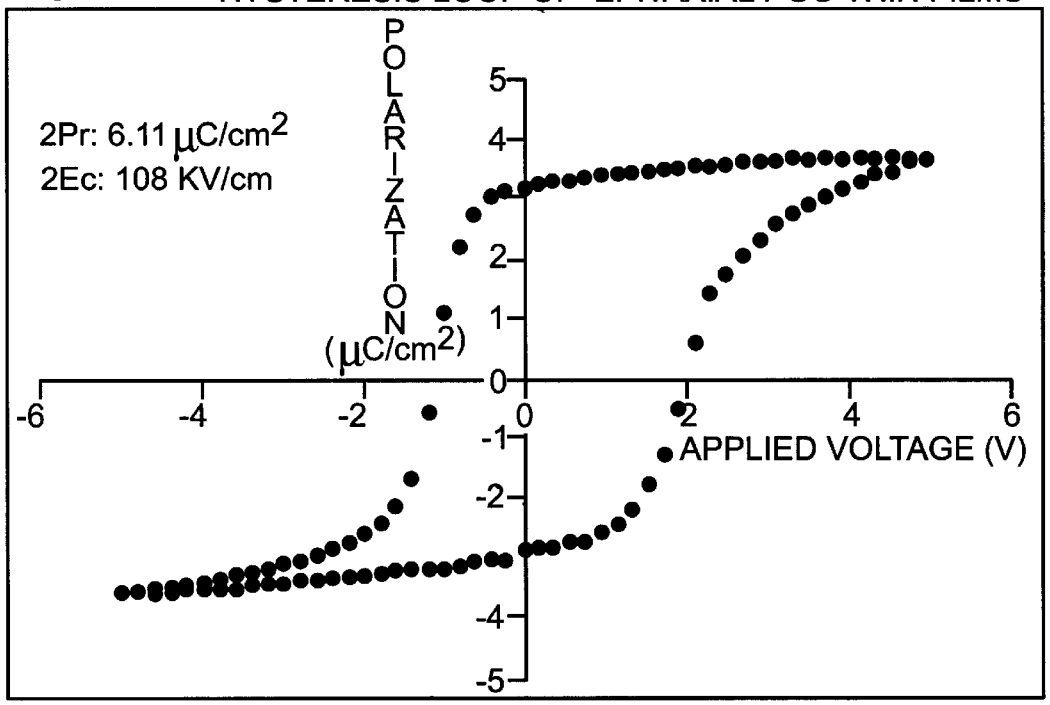
Fig. 14 HYSTERESIS LOOP OF EPITAXIAL PGO THIN FILMS AT VARIOUS VOLTAGES
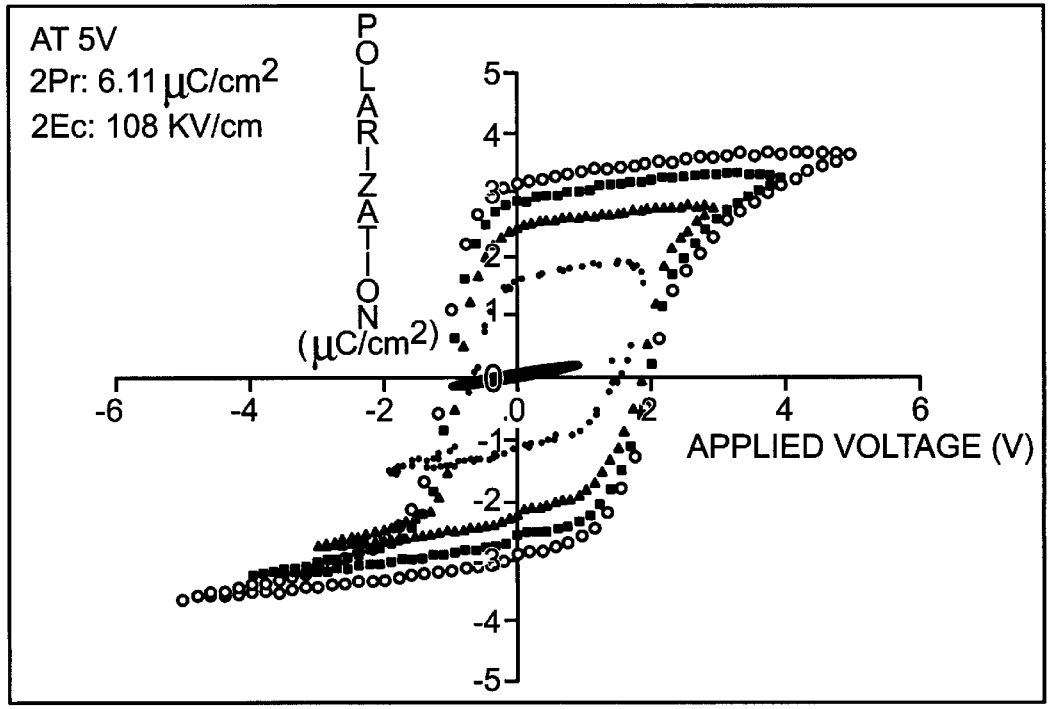

EPITAXIALLY GROWN LEAD GERMANATE FILM AND DEPOSITION METHOD

BACKGROUND AND SUMMARY OF THE INVENTION

The present invention relates generally to the fabrication of ferroelectric RAM (FeRAM) memory devices and, more particularly, to a method of maximizing the ferroelectric properties of Lead Germanium Oxide (PGO) thin films by epitaxially growing a PGO film with a c-axis orientation on a conductive electrode.

In recent years, the interest in ferroelectric materials for nonvolatile random access memory application (NvRAMs) has intensified. To meet the requirements for these memory applications, ferroelectric capacitors should have small size, low coercive field, high remanent polarization, low fatigue rate, and low leakage current. Some of the candidate ferroelectric materials under investigation for these applications are perovskite ferroelectrics such as $PbZr_{1-x}Ti_xO_3$ (PZT) or doped PZT, $BaTiO_3$, $SrTiO_3$, etc. These materials have a high Curie temperature and promising ferroelectrical properties such as large remanent polarization and low coercive field. However, these perovskite ferroelectrics are known to suffer from serious degradation problems such as fatigue (loss of switchable polarization with increasing reversal of polarization), aging, and leakage current, all of which affect the lifetime of the devices.

Many researchers are trying to improve the above-mentioned materials. An alternative approach is to find new ferroelectric materials. $SrBi_2Ta_2O_9$ (SBT) is a one of the new materials, which has fatigue-free properties. However, SBT must be deposited or annealed at temperatures greater than 750° C., which limits its applications.

Ferroelectric thin films for use in non-volatile memories have drawn much attention in recent years due to their bi-stable nature. Most of the studies on Ferroelectric Random Access Memories (FRAMs) have been concentrated on the memory structure with one transistor and one capacitor. The capacitor is made of a thin ferroelectric film sandwiched between two conductive electrodes (usually Pt). The circuit configuration and read/write sequence of this type memory are similar to that of DRAMs except no data refreshing is necessary in FRAMs. Therefore, the stored data are destroyed and must be restored after every reading. This reading process is named destructive read out (DRO). The fatigue problem observed in ferroelectric capacitor, therefore, becomes one of the major obstacles that limit the realization of these memories on a commercial scale. Fatigue is the decrease of switchable polarization (stored nonvolatile charge) with an increased number of switching cycles. The number of switching cycles is the summation of writing and reading pulses.

Another area of interest related to ferroelectric non-volatile memory study is the deposition ferroelectric thin film directly onto the gate area of FET, to form a ferroelectric-gate controlled FET. The ferroelectric-gate controlled device, such as metal-ferroelectric-silicon (MSF) FET, have been studied since the 1950s. Various modified MFSFET structures have been proposed, for example: Metal-Ferroelectric-Insulator-Silicon (MFIS) FET, Metal-Ferroelectric-Metal-Silicon (MFMS) FET, and Metal-Ferroelectric-Metal-Oxide-Silicon (MFMOS) FET. FRAMs with MFSFET structures have two major advantages over the 1T-1C configuration: (1) smaller memory cell territory in MFSFET, and (2) non-destructive read out (NDRO). The latter enables the MFSFET device to be read thousands of times without switching the ferroelectric polarization. Therefore, the fatigue is not the major issue in MFSFET devices.

Regardless the advantages in MFSFET devices over the 1T-1C FRAMs, little progress has been reported in the realization of practical MFSFET devices. This is due to the following reasons: (1) difficulty in depositing good crystalline ferroelectric thin film directly on silicon; (2) difficulty in cleaning; (3) strong retention problems; (4) single transistor arrays are not common; and (5) little theoretical work has been done on MFSFET devices.

From the analysis of MFMOS devices, it can be stated that lower ferroelectric capacitance results in higher memory window and lower programming voltage. Thicker film and lower $\in_r$ material can result in lower ferroelectric capacitance. However, a thicker film could increase programming voltage with respect to the switching field. Common oxide ferroelectric materials exhibit higher $\in_r$ and $T_c$, while non-oxide ferroelectrics exhibit lower $\in_r$ and $T_c$. Oxide $Pb_5Ge_3O_{11}$ thin film has very low $\in_r$ and moderate $T_c$ (178° C.). Table I compares the memory window of MFMOS devices with ferroelectric gate of $Pb_5Ge_3O_{11}$, PZT and $SrBi_2Ta_2O_9$ thin films. Even though the steady state polarization for $Pb_5Ge_3O_{11}$ thin film is much lower than that for PZT and $SrBi_2Ta_2O_9$ film films, the memory window for $Pb_5Ge_3O_{11}$ gate controlled MFMOS device is larger than its counterparts due to its low $\in_r$. The properties of $Pb_5Ge_3O_{11}$ thin film is listed in Table II.

TABLE I

Memory Windows for MFMOS Devices with Various Ferroelectrics

| Ferroelectric | Pb(Zr,Ti)O$_3$ | SrBi$_2$Ta$_2$O$_9$ | Pb$_5$Ge$_3$O$_{11}$ |
|---|---|---|---|
| P$_r$ ($\mu$C/cm$^2$) | 15 | 7 | 3.5 |
| $\epsilon_r$ | 1000 | 280 | 35 |
| d$_{Ferro}$ (Å) | 2000 | 2000 | 2000 |
| V$_{dep}$ (V) | 3.14 | 4.39 | 6.87 |
| P$_r$* ($\mu$C/cm$^2$) when V$_{dep}$ = 0.5 V | 2.4 | 0.8 | 0.25 |
| Memory Window 2P$_r$*/C$_F$ (V) | 1.08 | 1.29 | 3.23 |

Gate oxide (SiO$_2$) thickness: 100 Å
Steady state V$_{dep}$ is assumed to be 0.5 V

TABLE II

Comparison Various Ferroelectric Thin Films

| Material | Pb(Zr$_x$Ti$_{1-x}$)O$_3$ | SrBi$_2$(Ta$_x$Nb$_{1-x}$)O$_9$ | Pb$_5$Ge$_3$O$_{11}$ |
|---|---|---|---|
| $\epsilon_r$ | >800 | <300 | 30–50 |
| P$_r$ ($\mu$C/cm$^2$) | 15–35 | 4–11 | 3.5 |
| Tc | ~350° C. | ~300° C. | 178° C. |
| Melting Point | >1200° C. | >1200° C. | 738° C. |
| d$_{33}$ (CN$^{-1}$) | 2.1 × 10$^{-10}$ | in between | 6.2 × 10$^{-12}$ |
| CVD Deposition Temperature | 600–700° C. | 700–800° C. | 450–650° C. |
| Post Anneal | no | yes | no |
| Fatigue | Pt: Yes RuO$_2$: No | no | no |
| Structure | Perovskite | Layered Perovskite | P3 |
| Domain Walls | 180°, 90°, 70.5°, 60° | 180°, 90° | 180° |
| Prefer Orientation | MgO, SrTiO$_3$, Al$_2$O$_3$ | ?? | c-axis prefer orientation on oriented Ir and Pt |

The above-mentioned comparison of films shows that PGO thin films have advantages in terms of low deposition temperatures, fatigue characteristics, and retention properties.

Ferroelectric thin films are usually oxide ceramics with high melting temperatures. Therefore, it is very difficult to reduce the deposition temperature lower than 600° C. and still maintain the desired phases. This relationship holds regardless of deposition technique. For the most studied PZT thin films, for example, good electrical properties in conjunction with deposition temperatures below 600° C. have not been reported. This problem could be due to metastable pyrochlore phases which tend to form in this temperature range. Although low temperature deposition are possible with improved precursors, or using plasma to enhance the dissociation of precursors, very research in this area has been reported. Recently, the fatigue-free bi-layered ferroelectrics, namely $SrBi_2Ta_2O_9$ or $SrBi_2Nb_2O_9$, have been produced by MOCVD, sol-gel and pulse laser deposition. However, the deposition temperatures are still greater than 700° C. Further, CVD bi-layered ferroelectric thin films need post-annealing temperatures higher than 700° C. for long time (>1 hr) in order to obtain ferroelectricity.

An alternate method of solving the deposition temperature problem is to use alternate ferroelectric materials. PGO is a natural candidate because of its very low melting temperature (738° C.). At room temperature, the uniaxial ferroelectric PGO system with its polar direction parallel to the c-axis, belongs to the trigonal crystal class (point group: P3). This material transforms to the hexagonal (point group: P6) paraelectric phase above the Curie temperature ($T_C$=178° C.).

Thin films of PGO were made by thermal evaporation, flash-evaporation, and dc reactive sputtering methods. Polycrystalline films with partial c-axis orientation on n-type Si substrates have been reported. Due to the absence of saturated hysteresis loops, film quality is unpredictable. Recently, PGO thin films have been fabricated by pulsed laser ablation, sol-gel. PGO thin films (1–2 um) deposited by pulsed laser ablation on Pt coated Si substrates showed distorted hysteresis loops ($P_r$=2.5 uC/cm$^2$ and $E_c$=55 kV/cm). Crack-free and fully c-axis oriented PGO thin films (1600 Å) were successfully fabricated by Lee at low temperature (450° C. for 15 minutes) by sol-gel processing route on Pt/Ti/Si$_2$/Si substrates. A well saturated square hysteresis loop with near single crystal value of the remanent polarization ($P_r$=3.3 uC/cm$^2$), but a relatively high coercive field ($E_c$=135 kV/cm) was reported. However, sol-gel processing can not be used for high dense FeRAM applications or commercial fabrication processes.

The PGO film of the present invention was developed meet the requirements of one transistor (1T) and one transistor/one capacitor 1T/1C) FeRAM memory devices. In co-pending patent application Ser. No. 09/301,435, entitled "Multi-Phase Lead Germanate Film and Deposition Method", invented by Tingkai Li et al., filed on Apr. 28, 1999, a second phase of $Pb_3GeO_5$ is added to the $Pb_5Ge_3O_{11}$, increasing polycrystalline grain sizes, without C-axis orientation. The resultant film had increased Pr values and dielectric constants, and decreased Ec values. Such a film is useful in making microelectromechanical systems (MEMS), high speed multichip modules (MCMs), DRAMs, and FeRAMs.

In co-pending patent application Ser. No. 09/301,620, entitled "C-Axis Oriented Lead Germanate Film and Deposition Method", invented by Tingkai Li et al., filed on Apr. 28, 1999, a PGO film is disclosed. This film has primarily a c-axis orientation with a smaller Pr value, smaller dielectric constant, and larger Ec value. Such a film is useful in making 1T memories.

In co-pending patent application Ser. No. 09/301,634, entitled "Ferroelastic Lead Germanate Film and Deposition Method", invented by Tingkai Li et al., filed on Apr. 28, 1999, a CVD $Pb_3GeO_5$ film is described having improved ferroelastic properties useful in making MEMS and MCMs. The above-mentioned co-pending patent applications are incorporated herein by reference.

It would be advantageous if the ferroelectric properties of a single phase PGO film could be enhanced by crystallographic alignment. Further, it would be advantageous if the crystalline PGO film could be aligned primarily along the c-axis.

It would be advantageous if a ferroelectric PGO film could be commercially fabricated having phase uniformity and microstructure.

It would be advantageous if a single phase PGO film could be developed with ferroelectric properties associated with a single crystal structure.

It would be advantageous if the lattice mismatch could be minimized between ferroelectric capacitor electrodes and the intervening ferroelectric material. Further, it would be advantageous if the ferroelectric could be epitaxially grown from the electrode material to minimize the lattice mismatch.

Accordingly, in a lead germanium oxide (PGO) film, a method has been provided for forming an epitaxial PGO film having a c-axis orientation on a semiconductor wafer. The method comprising the steps of:
  a) mixing [Pb(thd)$_2$] and [Ge(ETO)$_4$] to form a PGO mixture having a molar ratio in the range of approximately 5:3;
  b) dissolving the mixture of Step a) with a solvent of tetrahydrofuran, isopropanol, and tetraglyme in a molar ratio of approximately 8:2:1, respectively, to form a precursor solution having a concentration of approximately 0.05 to 0.2 moles of PGO mixture per liter of sol vent;
  c) using a precursor vaporizer, heating the precursor solution to a temperature in the range of approximately 170 to 250 degrees C., creating a precursor gas;
  c$_1$) mixing the precursor gas in a reactor with an argon gas shroud flow in the range of approximately 3000 to 5000 standard cubic centimeters per minute (sccm), preheated to a temperature in the range of approximately 170 to 250 degrees C.;
  c$_2$) introducing an oxygen flow to the reactor in the range of approximately 2000 to 3000 sccm;
  d) heating the wafer to a temperature in the range of approximately 480 to 550 degrees C., to decompose the precursor gas formed in Step c) on the wafer;
  e) epitaxially growing a PGO film on a conductive electrode overlying the semiconductor wafer, the PGO film including a first phase of $Pb_5Ge_3O_{11}$, whereby a homogeneous film with ferroelectric characteristics is formed.

In some aspects of the invention, Step e) includes epitaxially growing more than 99% of the $Pb_5Ge_3O_{11}$ phase to have a c-axis crystallographic orientation, whereby the ferroelectric properties of PGO film are improved.

In some aspects of the invention, further steps follow Step e). Step f) anneals the PGO film formed in Step e) at a temperature in the range of approximately 500 to 550 degrees C. The atmosphere is controlled and selected to be from the group of oxygen, or oxygen with Pb atmospheres, whereby the c-axis orientation of the PGO film is enhanced;

In some aspects of the invention, a ferroelectric device is formed with the PGO film of in Step e), and includes further steps, following Step f), of:

g) forming a conductive electrode overlying the PGO film having a (111) orientation; and h) annealing the PGO film formed in Step e) at a temperature in the range of approximately 500 to 550 degrees C. The atmosphere is selected from the group of oxygen or oxygen with Pb atmospheres, whereby the interface between the PGO film, formed in Step e), and the electrode formed in Step g), is improved.

Steps f) and h) include using a rapid thermal annealing (RTA) process to anneal the PGO film. The RTA process has a thermal rate in the range of approximately 10 to 200 degrees C. per second, and a time duration of approximately 10 to 1800 seconds.

A PGO film having improved ferroelectric properties is also provided. The PGO film comprises a first phase of $Pb_5Ge_3O_{11}$. The $Pb_5Ge_3O_{11}$ phase has a c-axis crystallographic orientation of greater than 99%, whereby the c-axis orientation and homogeneous structure promote ferroelectric film properties. In some aspects of the invention, the PGO film further comprises a second phase of $Pb_3GeO_5$. The phase range of the $Pb_3GeO_5$ film is approximately 0.1 to 5%.

A capacitor having ferroelectric properties is also provided. The capacitor comprises a first conductive electrode, a PGO film including a $Pb_5Ge_3O_{11}$ phase with a c-axis crystallographic orientation of greater than 99% overlying the first electrode, and a second conductive electrode overlying the PGO film. The capacitor has a 2Pr of approximately 6.11 microcoulombs per centimeter squared (uC/Cm$^2$) and a 2Ec of approximately 108 kilovolts per centimeter (kV/cm) at an applied voltage of 5 volts.

BRIEF DESCRIPTION OF THE DRAWINGS

FIG. 5 is the X-ray pattern of partially epitaxial PGO films of the present invention deposited at 500° C.

FIG. 6 is the X-ray pattern of a typical epitaxial $Pb_5Ge_3O_{11}$ film with c-axis orientation (prior art).

FIGS. 7 and 8 illustrate SEM micrograph analysis of the formation of the epitaxial grown PGO thin films having c-axis direction.

FIGS. 10a and 10b illustrate fatigue properties of the PGO film of the present invention.

FIGS. 13 and 14 illustrate ferroelectric properties of the epitaxial c-axis oriented $Pb_5Ge_3O_{11}$ thin films with Ir (111) electrodes.

DETAILED DESCRIPTION OF THE PREFERRED EMBODIMENT

The epitaxial thin films of the present invention have excellent ferroelectric properties. These epitaxial grown ferroelectric thin films, therefore, have important implications in the fabrication of FeRAM devices. The present invention provides a method to growing epitaxial ferroelectric $Pb_5Ge3O_{11}$ thin films along the c-axis orientation. The X-ray diffraction and SEM microstructure confirm the formation of the epitaxial ferroelectric $Pb_5Ge_3O_{11}$ thin films along with c-axis. A typical 300-nm thick epitaxial $Pb_5Ge_3O_{11}$ thin film with Ir (111) electrodes exhibits excellent ferroelectric and electric properties: remanent polarization (2Pr) and coercive field (2Ec) values. As shown below, early experimental data shows 2Pr and 2Ec of about 6.11 $\mu C/cm^2$ and 108 kV/cm, respectively. The films also show excellent fatigue characteristics: no fatigue is observed up to $1\times10^9$ switching cycles. The leakage current increases with applied voltage, and is about $9.5\times10^{-7}$ A/cm$^2$ at 100 kV/cm. The dielectric constant is about 30 to 70. These high quality MOCVD $Pb_5Ge_3O_{11}$ films can be used for FRAM device applications.

The present invention is a lead germanium oxide (PGO) film having improved ferroelectric properties comprising an epitaxial first phase of $Pb_5Ge_3O_{11}$ film. As is well known in the art, the characteristics of an epitaxial film are similar to single crystal material, and physically distinguishable from either a true single crystal or polycrystalline film. The $Pb_5Ge_3O_{11}$ phase has a c-axis crystallographic orientation of greater than 99%, whereby the c-axis orientation promotes ferroelectric film properties. The $Pb_5Ge_3O_{11}$ phase is epitaxially grown. Therefore, the crystal structure of the $Pb_5Ge_3O_{11}$ phase is substantially single crystal. The lattice mismatch in the structure is very small. In fact, the grain boundaries that do exist are considered inconsequential enough to called lattice defects formed in the epitaxial growth. As a result, the PGO film is extremely homogeneous. The homogeneity and c-axis orientation of the PGO film act to optimally promote ferroelectric properties.

In some aspects of the invention, the PGO film includes a second phase of $Pb_3GeO_5$. The phase range of the $Pb_3GeO_5$ phase is approximately 0 to 5%. That is, in some aspects of the invention, no second phase exists. The Pb excess from the $Pb_3GeO_5$ phase avoids Pb deficiency, and enhances the epitaxial growth of the $Pb_5Ge_3O_{11}$ phase.

Figure 1:
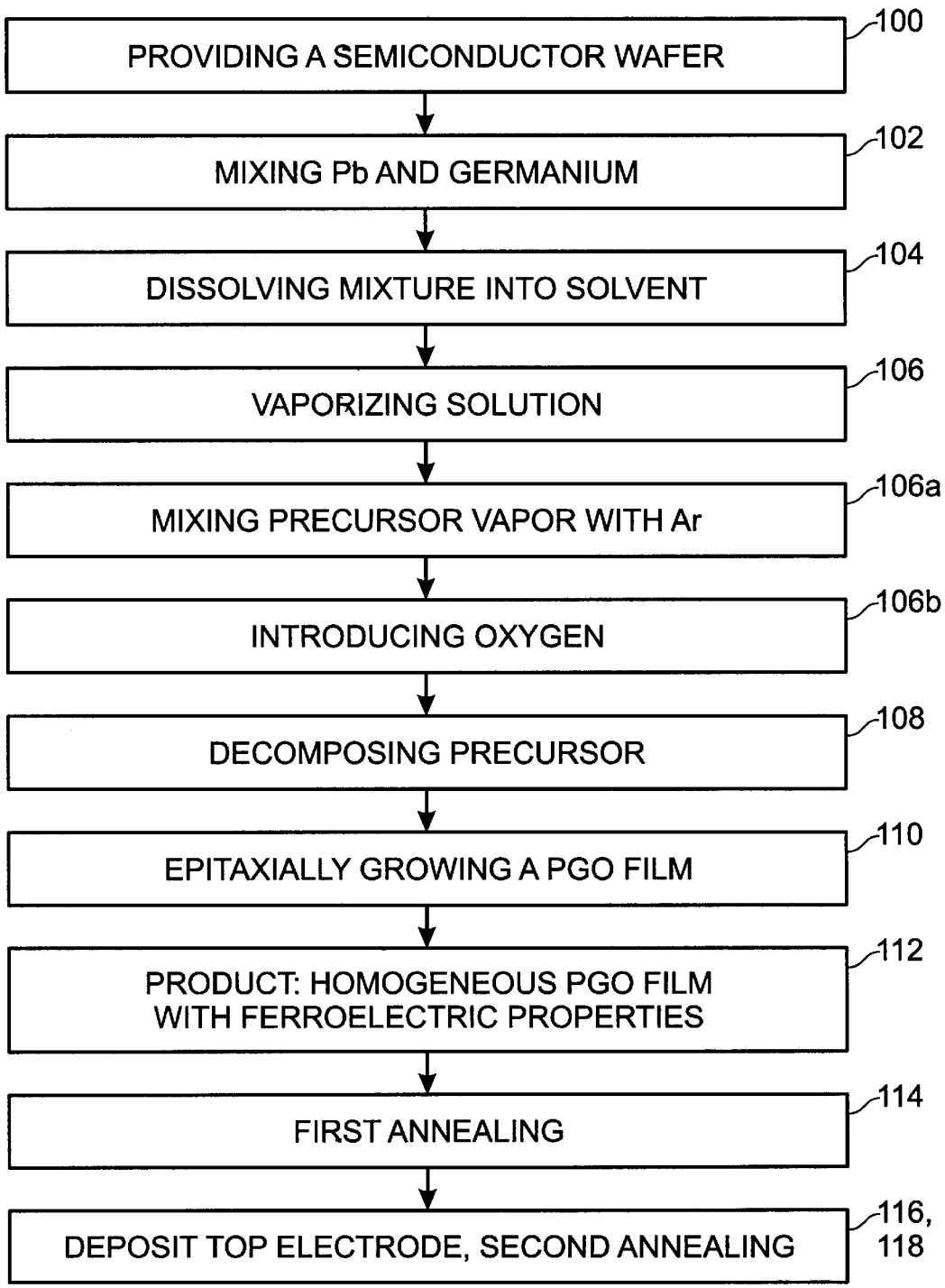
FIG. 1 illustrates steps in a method for epitaxially growing a PGO film.

FIG. 1 illustrates steps in a method for epitaxially growing a PGO film. Step 100 provides a semiconductor wafer. In some aspects of the invention a further step preceded Step 102 (not shown) which deposits a conductive electrode having a (111) crystallographic orientation overlying the semiconductor wafer. The electrode material is selected from the group consisting of iridium and platinum. The above-mentioned materials are used as electrodes in ferroelectric type capacitors. Step 102 mixes [Pb(thd)$_2$] and [Ge(ETO)$_4$] to form a PGO mixture having a molar ratio in the range of approximately 4.5:3 to 5.5:3. [Pb(thd)$_2$], or Pb, is Bis(2,2,6,6-tetramethyl-3.5-heptanedionato)lead (II) and [Ge(ETO)$_4$] is germanium (IV) ethoxide. The method of the invention will work even with molar ratios outside this range. In some aspects of the invention, Step 102 includes mixing the [Pb(thd)$_2$] and [Ge(ETO)$_4$] in a molar ratio of approximately 5:3. Pb ratios of greater than 5:3 are typically used when high precursor temperatures are used, see Step 106 below. Alternately, Pb ratios of lower than 5:3 are used when a Pb atmosphere is provided during deposition and annealment processes, see Steps 106–118 below. Although the above-mentioned materials are generally preferred, a list of alternate materials is provided in Table 3.

Liquid precursors such as germanium alkoxides, germanium halides, lead alkyls, and lead halides use a bubbler with a controlled temperature to generate precursor vapors. Solid precursors, such as lead B-diketonates, are dissolved in a solvent and use a liquid delivery system coupled with a flash vaporizer to generate precursor vapors. Table 3 is a list of PGO film precursors that are alternately used in some aspects of the present invention. Table 4 is a list of solvents that are alternately available for use in some aspects of the present invention.

TABLE 3

The properties of precursors for PGO films

| Precursor | Formula | Appearance at room temperature | Moisture stability | Vapor Pressure (mm Hg) | Decomposition Temp. (° C.) |
|---|---|---|---|---|---|
| Ge(ETO)$_4$ | GeH$_4$<br>Ge$_2$H$_6$<br>Ge$_3$H$_8$<br>Ge(OC$_2$H$_5$)$_4$<br>GeCl$_4$<br>(C$_2$H$_5$)$_2$GeCl$_2$ | colorless liquid | sensitive | 185° C. | |
| Pb Tetraphenyl | Pb(C6H5)4 | white powder | | 230° C./0.05 | 325° C. |
| Pb(TMHD)$_2$ | Pb(C$_{11}$H$_{19}$O$_2$)$_2$<br>Pb(C$_2$H$_5$)$_4$ | white powder | | 180° C./0.05 | 325° C. |

TABLE 4

The properties of solvents for PGO films

| Solvents | Formula | Boiling Temp. (° C.) |
|---|---|---|
| Tetrahydrofuran (THF) | C$_4$H$_8$O | 65–67° C. |
| Iso-propanol | C$_3$H$_7$OH | 97° C. |
| Tetraglyme | C$_{10}$H$_{22}$O$_5$ | 275° C. |
| Xylene | C$_6$H$_4$(CH$_3$)$_2$ | 137–144° C. |
| Toluene | C$_6$H$_5$CH$_3$ | 111° C. |
| Butyl ether | [CH$_3$(CH$_2$)$_3$]$_2$O | 142–143° C. |
| Butyl acetate | CH$_3$CO$_2$(CH$_2$)$_3$CH$_3$ | 124–126° C. |
| 2-Ethyl-1-hexanol | CH$_3$(CH$_2$)$_3$CH(C$_2$H$_6$)CH$_2$OH | 183–186° C. |

Step 104 dissolves the mixture of Step 102 with a solvent of tetrahydrofuran, isopropanol, and tetraglyme to form a precursor solution. In some aspects of the invention, Step 104 includes the solvents tetrahydrofuran, isopropanol, and tetraglyme being in a molar ratio of approximately 8:2:1, respectively. Alternately, tetrahydrofuran is replaced with butyl ether. Step 104 includes forming a precursor solution having a concentration of approximately 0.05 to 0.2 moles of PGO mixture per liter of solvent. Although the above-mentioned solvents are generally preferred, a list of alternate solvents is provided in Table 4.

Step 106, from the solution formed in Step 104, creates a precursor gas. When Step 100 provides a precursor vaporizer, Step 106 includes using the precursor vaporizer to heat the precursor solution to a temperature in the range of approximately 170 to 250 degrees C., whereby the precursor gas is formed. As mentioned above, a wider range of vaporizer temperatures is possible by adjusting the molar ratio of the lead and germanium compounds in Step 102. A typical reactor is equipped with a controlled heating systems for precursor gas and carrier gas lines, exhaust lines, gas flow flange and reactor wall. The temperatures of gas flow flange and reactor wall are controlled to avoid the decomposition or condensation of oxide precursors Step 108 decomposes the precursor gas formed in Step 106 on the wafer. Although a larger range of temperatures is possible, Step 108 includes heating the wafer to a temperature in the range of approximately 480 to 550 degrees C. As with the other deposition variables, this relatively low temperatures tends to promote a low PGO deposition rate that is favorable for epitaxially growth.

Step 110 epitaxially grows a PGO film on the conductive electrode, including a first phase of Pb$_5$Ge$_3$O$_{11}$. Step 110 includes epitaxially growing the Pb$_5$Ge$_3$O$_{11}$ to have a c-axis crystallographic orientation. Typically, more than 99% of the crystals of the Pb$_5$Ge$_3$O$_{11}$ phase are aligned in the c-axis orientation. In some aspects of the invention, Step 110 includes epitaxially growing a second phase of Pb$_3$GeO$_5$ having a phase range of approximately 0 to 5%. Step 112 is a product, a PGO film that is homogeneous to promote ferroelectric characteristics.

In some aspects of the invention, Step 100 provides a liquid pump. Then, a further step follows Step 104, and precedes Step 106. Step 104a (not shown) uses the liquid pump to introduce the precursor solution of Step 104 to the precursor vaporizer in Step 106 at a rate in the range of approximately 0.05 to 0.2 milliliters per minute (ml/min). The low concentration of Pb and Ge, relative to the solvent, promotes a low PGO deposition rate that aids epitaxial growth.

In some aspects of the invention, the IC, or semiconductor wafer is located in a reactor, and further steps follow Step 106. Step 106a mixes the precursor gas in the reactor with an argon gas shroud flow in the range of approximately 3000 to 5000 standard cubic centimeter minutes (sccm), preheated to a temperature in the range of approximately 170 to 250 degrees C. Wider ranges of shroud flow and temperature are also possible. Step 106b introduces an oxygen flow to the reactor in the range of approximately 2000 to 3000 sccm, whereby a low PGO film deposition rate is promoted. The oxygen atmosphere alternately includes pure O$_2$, N$_2$O, or a mixture of both. Step 100 provides that the IC wafer is located on a wafer chuck in the reactor. Then, Steps 106a and 106b include establishing a precursor vapor pressure in the range of approximately 30 to 50 torr (T), and Step 108 includes establishing a reactor chamber pressure in the range of approximately 0.1 to 5 T. A typical reactor system utilizes separate line and gas curtain flows for oxygen or reactants to inlet oxygen or reactants close to the surface of substrates to avoid the prereaction in gas phase before deposition of PGO film on the surface of substrates. The oxygen and reactant distributions for large area substrates are controlled by multi-lines and mass flow controllers. Again, the high pressure differential between the vaporizer and reactor promotes a low deposition rate necessary for epitaxially growth of the PGO film.

As is well known, low material deposition rates are generally undesirable. Low deposition rates increase process times and, therefore, process costs. Even though the present invention process uses a relatively slow MOCVD deposition for PGO films, these processes are still faster and cheaper that corresponding MBE processes.

In some aspects of the invention, further steps follow Step 112. Step 114 anneals the PGO film grown in Step 110 at a temperature in the range of approximately 500 to 550 degrees C. in an atmosphere selected from the group of oxygen and oxygen with Pb atmospheres, whereby the c-axis orientation of the PGO film is enhanced. Alternately, a wider range deposition temperatures are used with compensation made in the second annealing process. Annealing processes are typically conducted in an annealing chamber separate from the reactor used for deposition.

In some aspects of the invention a ferroelectric device is formed with the PGO film of Step 110. That is, a conductive electrode underlies the PGO film. Then, further steps follow Step 110. Step 116 forms a conductive electrode having a (111) orientation overlying the PGO film formed in Step 110. Step 118 anneals the PGO film formed in Step 110 at a temperature in the range of approximately 500 to 550 degrees C. in an atmosphere selected from the group of oxygen and oxygen with Pb atmospheres. The interface between the PGO film, formed in Step 110, and the electrode formed in Step 116, is improved.

Steps 114 and 118 include the oxygen being introduced at a partial pressure in the range of approximately 10 to 100%, with a partial pressure of greater than 20% being preferred. In some aspects of the invention, Steps 114 and 118 include using annealing methods selected from the group consisting of furnace and rapid thermal annealing (RTA) at a thermal ramp-up rate in the range of approximately 10 to 200 degrees C. per second, and a time duration of approximately 10 minutes.

In some aspects of the invention, a high speed rotational system is provided in Step 100, upon which the semiconductor wafer is mounted. Then, Step 110 includes controlling the speed of rotation to be in the range between 600 and 1000 rpm, whereby the homogeneity of the resultant PGO film is enhanced.

Figure 2:
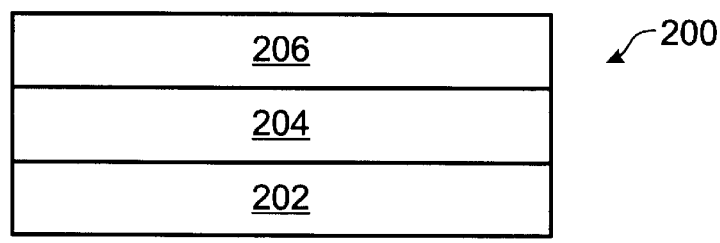
FIG. 2 illustrates a capacitor, using the present invention PGO film, having ferroelectric properties.

FIG. 2 illustrates a capacitor, using the present invention PGO film, having ferroelectric properties. Capacitor 200 comprises a first conductive electrode 202, having a (111) crystallographic orientation, a PGO film 204 including an epitaxial $Pb_5Ge_3O_{11}$ phase with a c-axis crystallographic orientation, overlying first electrode 202, and a second conductive electrode 206 overlying PGO film 204 with a (111) crystallographic orientation, whereby a PGO film capacitor is formed. In some aspects of the invention the c-axis orientation of PGO film first phase 204 is greater than 99%. There is little lattice mismatch between electrodes 202/206 and PGO film 204 because PGO film 204 is epitaxially grown on electrode 202, and electrode 206 is epitaxially grown from PGO film 204. The choice of Ir, Pt, and Ir/Pt as electrode materials also operates to minimize lattice mismatch. In some aspects of the invention, PGO film 204 includes a second phase of $Pb_3GeO_5$ having a phase range of approximately 0 to 5%. In some aspects of the invention, barrier layers (not shown), such as Ti, TiN, Ta, TaN are used between PGO thin film 204 and electrodes 202/206.

Capacitor 200 has ferroelectric properties which include polarization (Pr) and coercive field (Ec). The 2Pr is approximately 6.1 microcoulombs per centimeter squared ($uC/cm^2$) and the 2Ec is approximately 108 kilovolts per centimeter (kV/cm) at an applied voltage of 5 volts.

Capacitor 200 has ferroelectric properties which include a dielectric constant in the range of approximately 30 to 70, approximately a 95 to 99% polarization (Pr) after $1 \times 10^9$ cycles of polarization switching (FIG. 8), and approximately a 80 to 90% retention of polarity after a duration of approximately 1000 seconds.

Present invention epitaxially films were grown for testing. An EMCORE oxide MOCVD reactor with liquid delivery system was used for the growth of $Pb_5Ge_3O_{11}$ films. Such a system is shown in FIG. 1 in co-pending patent application Ser. No. 09/301,435, entitled "Multi-Phase Lead Germanate Film and Deposition Method", invented by Tingkai Li et al., filed on Apr. 28, 1999, attorney docket No. SLA400. The $Pb_5Ge_3O_{11}$ films were deposited on 6" Pt or Ir covered Si wafers using MOCVD processes. The precursors for PGO thin films are listed in Table 5. Lead Bis(2,2,6,6-tetramethyl-3,5-heptanedionato) [$Pb(thd)_2$] and germanium ethoxide [$Ge(ETO)_4$] with a molar ratio of 5:3 were dissolved in a mixed solvent of butyl ether or tetrahydrofuran, isopropanol and tetraglyme in the molar ratio of 8:2:1. The precursor solutions have a concentration of 0.05–0.2 M/L of PGO.

TABLE 5

Properties of precursors for PGO thin films

| Precursor | Formula | Vapor Pressure (mm Hg) | Decomposition Temperature (° C.) |
|---|---|---|---|
| $Pb(TMHD)_2$ | $Pb(C_{11}H_{19}O_2)_2$ | 180° C./0.05 | 325° C. |
| $Ge(ETO)_4$ | $Ge(C_2H_5O)_4$ | b.p. 185° C. | |

The solution was injected into a vaporizer (170–250° C.) by a pump at a rate of 0.05–0.2 ml/min. The precursor gases were brought into the reactor using a preheated argon flow at 170–250° C. The deposition temperatures and pressure were 500–550° C. and 0.1–5 torr, respectively. The growth rates were controlled to be below 2 nanometers (nm) per minutes. The shroud flow into the reactor was Ar 3000–5000 sccm, and oxygen 2000–3000 sccm. After deposition of top electrodes on the as-deposited PGO film, an RTA processes from 500–550° C., with oxygen atmosphere and duration of 5–20 minutes, were used to improve the ferroelectric and electrical properties of PGO thin films. The basic composition, phase, ferroelectric and electrical properties of the $Pb_5Ge_3O_{11}$ films were measured. The composition of the $Pb_5Ge_3O_{11}$ films was analyzed by using ultra high resolution X-ray photoelectron Spectrometer (XPS) and energy dispersion X-ray analysis (EDX). The phases of the films were identified using X-ray diffraction. The thickness and surface morphologies of the PGO films were investigated by Scanning Electron Microscope. The leakage currents and dielectric constants of the films were measured using an HP4155-6 precision semiconductor parameter analyzer and Keithley 182 CV analyzer, respectively. The ferroelectric properties of the films were measured by a standard RT66A tester.

Figure 3:
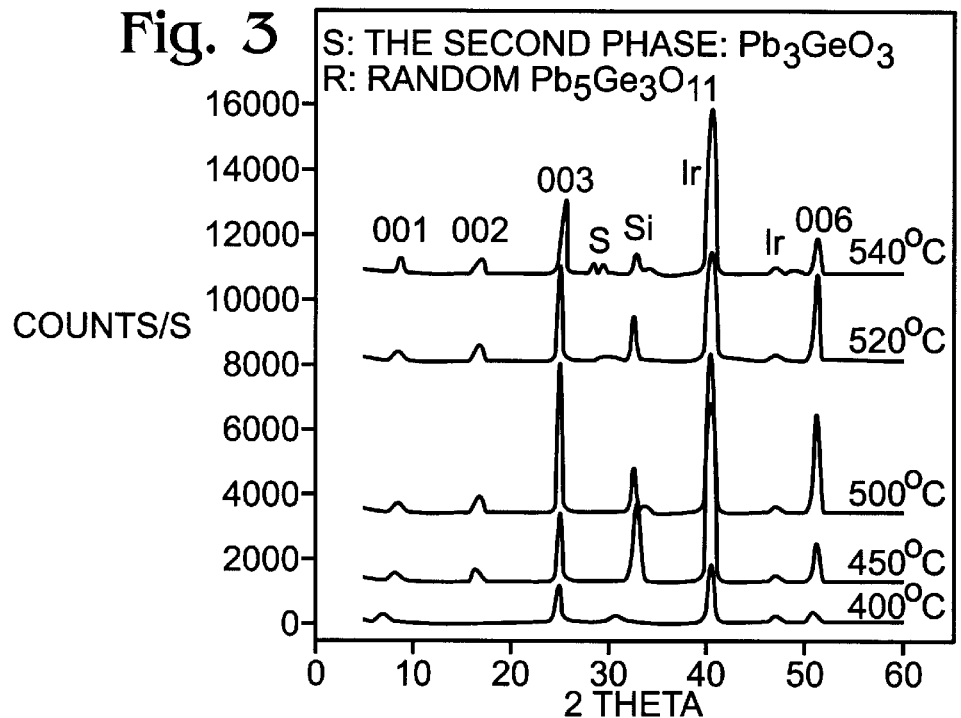
FIG. 3 is the X-ray pattern of $Pb_5Ge_3O_{11}$ films deposited at temperatures in the range of 400–550° C.

FIG. 3 is the X-ray pattern of $Pb_5Ge_3O_{11}$ films deposited at temperatures in the range of 400–550° C. The nucleation of C-axis oriented PGO phase started at a deposition temperature below 400° C. With increasing substrate temperature, the grain growth and c-axis oriented PGO film occurs. The very sharp (001), (002), (003), (004), (005), and (006) peaks are observed at a substrate temperature of 500° C., which indicated very well-crystallized $Pb_5Ge_3O_{11}$ film with preferred c-axis orientation. Over 500° C., a small second phase $Pb_3GeO_5$ is found and increases with increasing substrate temperature, along with the decreasing the intensity of the c-axis peaks. For c-axis orientation, the best deposition temperatures are typically around 500° C.

Figure 4:
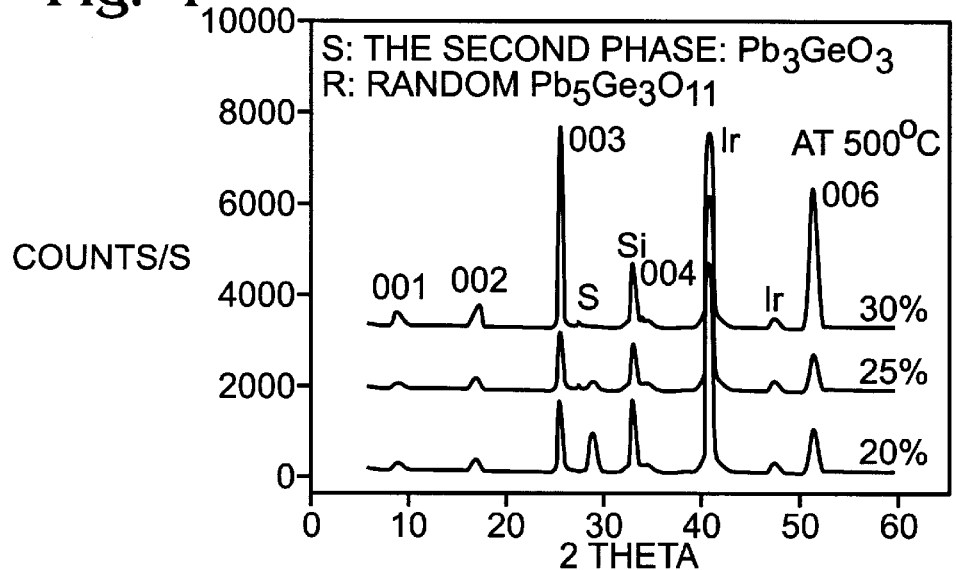
FIG. 4 is the X-ray pattern of $Pb_5Ge_3O_{11}$ films deposited at 500° C., with various oxygen partial pressures.

FIG. 4 is the X-ray pattern of $Pb_5Ge_3O_{11}$ films deposited at 500° C., with various oxygen partial pressures. With increasing oxygen partial pressure, c-axis orientation peaks tend to be stronger. However, higher oxygen partial pressure results in the prereaction with precursor gases in gas phase, causing a higher surface roughness and particles. Therefore, appropriate oxygen partial pressure is critical. In addition, a low deposition pressure, from 0.1 to 5 torr, and lower growth rates, below 2 nm/per minute, are typically used to grow epitaxial PGO thin films of the present invention.

FIG. 5 is the X-ray pattern of partially epitaxial PGO films of the present invention deposited at 500° C. X-ray analysis confirms the formation of the epitaxial c-axis oriented $Pb_5Ge_3O_{11}$ films. FIG. 6 is the X-ray pattern of a typical epitaxial $Pb_5Ge_3O_{11}$ film with a c-axis orientation (prior art). From FIGS. 5 and 6 very sharp (001), (002), (003), (004), (005), and (006) peaks are observed, which indicate the formation of epitaxial c-axis oriented $Pb_5Ge_3O_{11}$ film.

FIGS. 7 and 8 illustrate SEM micrograph analysis of the formation of the epitaxial grown PGO thin films having c-axis direction. FIG. 7 illustrates the microstructure of the partial epitaxial PGO thin films. FIG. 8 illustrates the microstructure of a typical epitaxial c-axis oriented PGO thin film of the present invention. The epitaxial growth is formed layer by layer. The microstructure analysis shows a layered structure of surface morphology, which is a typical epitaxial growing style.

Figure 9A:
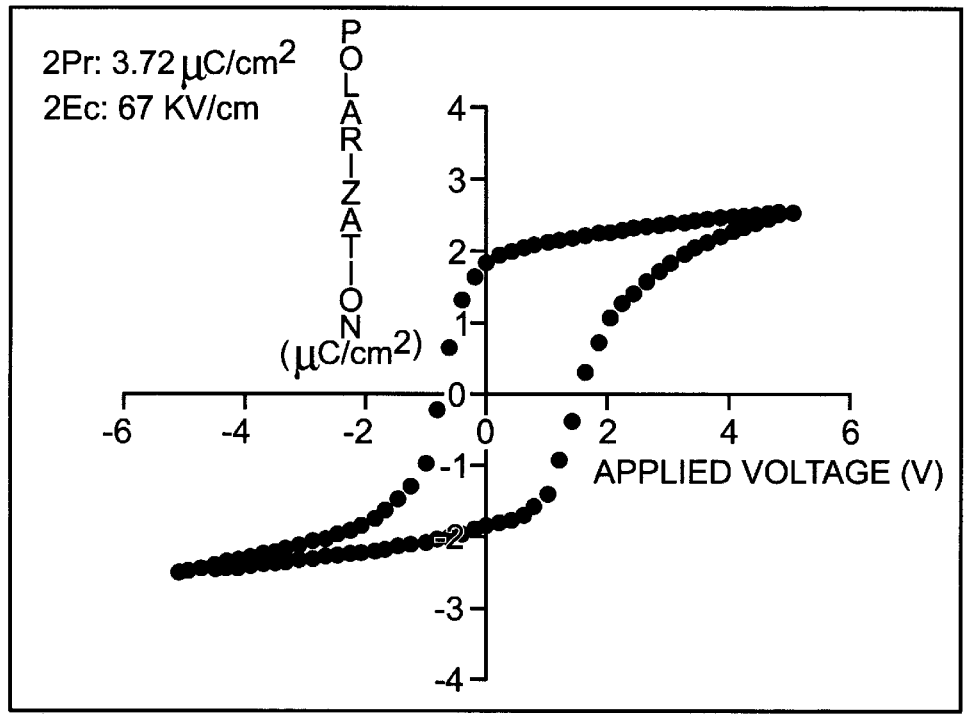
FIGS. 9a and 9b illustrate the ferroelectric properties of the as-deposited partial epitaxial $Pb_5Ge_3O_{11}$ film of the present invention.
Figure 9B:
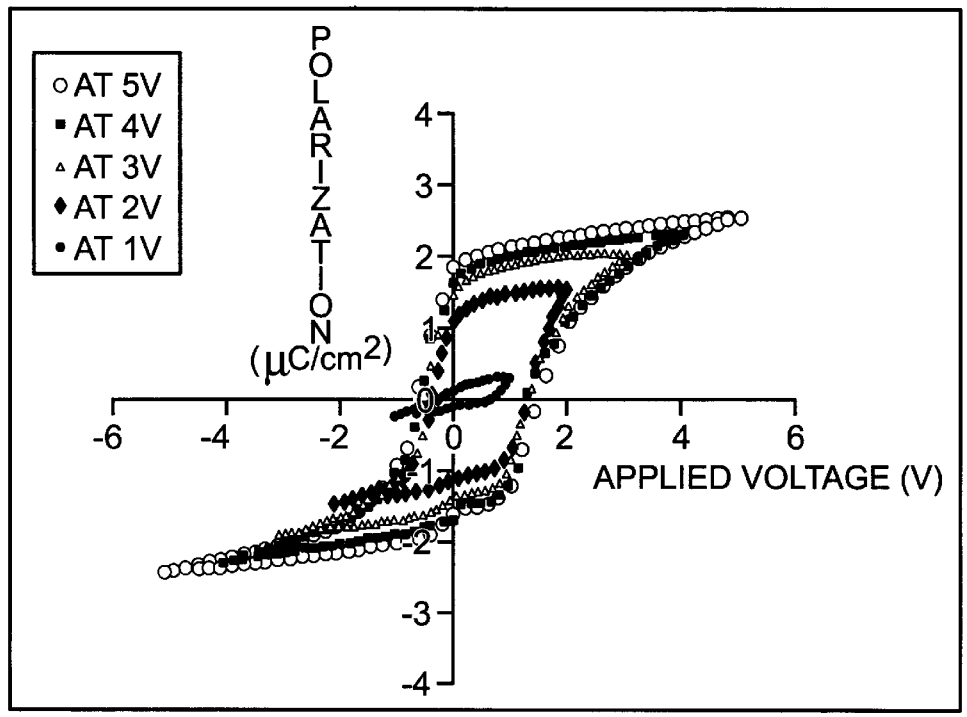

FIGS. 9a and 9b illustrate the ferroelectric properties of the as-deposited partial epitaxial $Pb_5Ge_3O_{11}$ film of the present invention. After RTP annealing at 500° C. for 10 minutes, the ferroelectric properties of the partial epitaxial $Pb_5Ge_3O_{11}$ films are further improved. FIG. 9a shows a square and saturated hysteresis loop with a remanent polarization (2Pr) of 3.72 $\mu C/cm^2$, and a coercive field (2Ec) of 67 kV/cm. With increased voltage, the Pr and Ec values increase and the hysteresis loops tend to be square and saturated, as shown in FIG. 9b.

FIGS. 10a and 10b illustrate fatigue properties of the PGO film of the present invention. The fatigue properties of the partial epitaxial $Pb_5Ge_3O_{11}$ thin film were measured at 5V (100 kHz bipolar square wave). The film shows no fatigue after the sample was switched $1\times 10^9$ cycles. FIG. 10a shows the fatigue properties of the partial epitaxial $Pb_5Ge3O_{11}$ thin films on an Ir(111)/Ti/SiO$_2$/Si substrate. No noticeable change in the hysteresis loops was observed after the fatigue test. The 2Pr and 2Ec values of the films were 3.72 $\mu C/cm^2$ and 67 kV/cm before fatigue test, and 3.70 $\mu C/cm^2$ and 73 kV/cm after fatigue test, as shown in FIG. 10b.

It is believed that the superior fatigue properties of the $Pb_5Ge_3O_{11}$ films are due to the $Pb_5Ge_3O_{11}$ lattice structure. $Pb_5Ge3O_{11}$ material has large polarization along c-axis, but little or no polarization along a or b-axis. Thus, most of the domain configuration is the 180° domain. For this reason, the $Pb_5Ge_3O_{11}$ has excellent fatigue properties, similar to bi-layered oxides.

Figure 11:
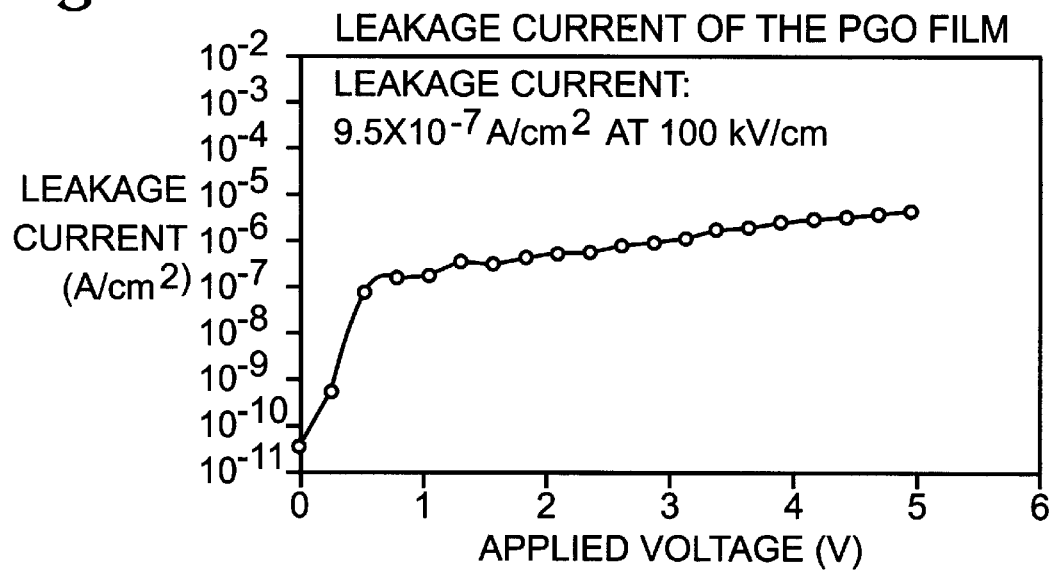
FIG. 11 illustrates the I–V curve of the present invention PGO film.

FIG. 11 illustrates the I–V curve of the present invention PGO film. Low leakage current density is an important consideration for memory device applications. FIG. 11 shows the I–V curve of a 300-nm thick partial epitaxial $Pb_5Ge_3O_{11}$ film. Excellent I–V characteristics are observed. The leakage current density of the $Pb_5Ge_3O_{11}$ thin films increases with respect to increased voltage, and is about $9.5\times 10^{-7}$ A/cm$^2$ at 100 kV/cm.

Figure 12:
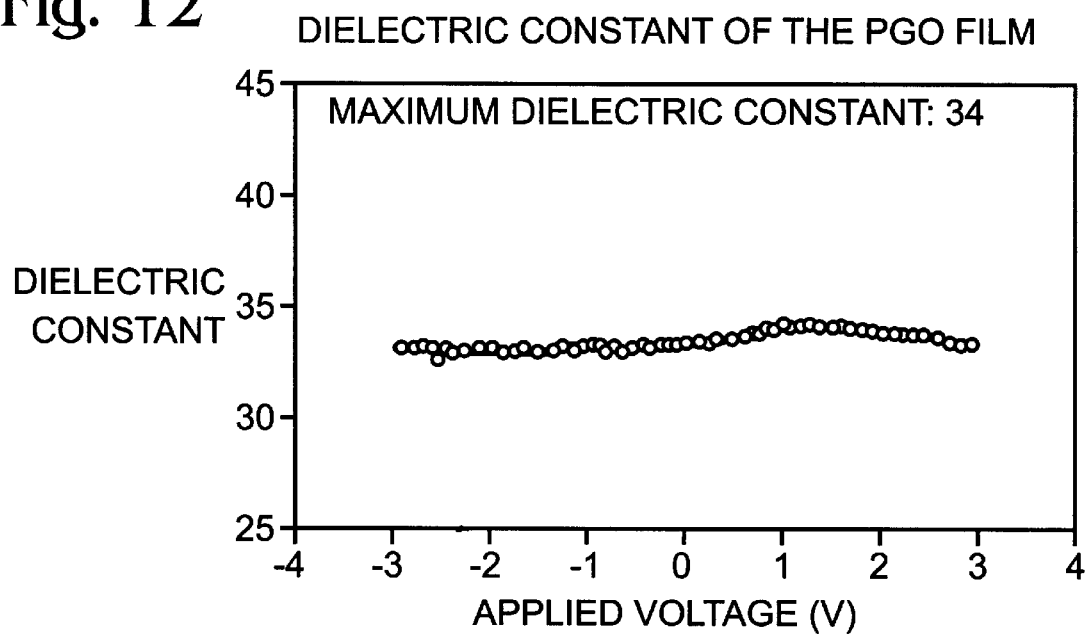
FIG. 12 illustrates the dielectric constant of the present invention PGO film.

FIG. 12 illustrates the dielectric constant of the present invention PGO film. The dielectric constant is another important characteristic in memory devices, especially one-transistor memories. The dielectric constant of $Pb_5Ge_3O_{11}$ thin films shows a behavior similar to most ferroelectric materials. The dielectric constant changes with respect to the applied voltage. The maximum dielectric constant of the partial epitaxial $Pb_5Ge_3O_{11}$ thin films is shown to be about 34.

FIGS. 13 and 14 illustrate ferroelectric properties of the epitaxial c-axis oriented $Pb_5Ge_3O_{11}$ thin films with Ir (111) electrodes. The remanent polarization (2Pr) and coercive field (2Ec) values are about 6.11 $\mu C/cm^2$ and 108 kV/cm, respectively. The films also show excellent fatigue characteristics: no fatigue was observed up to $1\times 10^9$ switching cycles. The leakage current increased with respect to increased voltage, and is about $9.7\times 10^{-7}$ A/cm$^2$ at 100 kV/cm. The dielectric constant is about 30 to 70. The high quality MOCVD $Pb_5Ge_3O_{11}$ films can be used for one-transistor/one capacitor memory and single-transistor memory applications.

The present invention provides a substantially single crystal PGO film and deposition method which optimizes the ferroelectric properties of the film. The PGO film and adjacent electrodes are all epitaxially grown to minimize mismatch between the structures. The MOCVD deposit method and RTP annealing procedures permit PGO film to be epitaxially grown in commercial fabrication processes. Other variations and embodiments of the present invention will occur to those skilled in the art.

What is claimed is:

1. In a lead germanium oxide (PGO) film, a method for epitaxially growing a PGO film on a semiconductor wafer, the method comprising the steps of:
   a) mixing and to form a PGO mixture having a molar ratio in the range of approximately 4.5:3 to 5.5:3;
   b) dissolving the mixture of Step a) with a solvent of tetrahydrofuran, isopropanol, and tetraglyme to form a precursor solution;
   c) from the solution formed in Step b), creating a precursor gas;
   d) decomposing the precursor gas formed in Step c) on the wafer; and
   e) epitaxially growing a PGO film, including a first phase of $Pb_5Ge_3O_{11}$, whereby a homogeneous film with ferroelectric characteristics is formed.

2. A method as in claim 1 in which Step a) includes mixing the and in a molar ratio of approximately 5:3.

3. A method as in claim 1 in which Step b) includes the solvents tetrahydrofuran, isopropanol, and tetraglyme being in a molar ratio of approximately 8:2:1, respectively.

4. A method as in claim 1 in which Step b) includes forming a precursor solution having a concentration of approximately 0.05 to 0.2 moles of PGO mixture per liter of solvent.

5. A method as in claim 1 wherein a liquid pump and precursor vaporizer are provided, in which Step c) includes using the precursor vaporizer to heat the precursor solution to a temperature in the range of approximately 170 to 250 degrees C., whereby the precursor gas is formed, and including a further step, following Step b), and preceding Step c), of:
   b$_1$) using the liquid pump to introduce the precursor solution of Step b) to the precursor vaporizer in Step c) at a rate in the range of approximately 0.05 to 0.2 milliliters per minute (ml/min).

6. A method as in claim 1 in wherein the semiconductor wafer is located in a reactor, and including further steps, following Step c), of:

$c_1$) mixing the precursor gas in the reactor with an argon gas shroud flow in the range of approximately 3000 to 5000 standard cubic centimeter minutes (sccm), preheated to a temperature in the range of approximately 170 to 250 degrees C.; and $c_2$) introducing an oxygen flow to the reactor in the range of approximately 2000 to 3000 sccm.

7. A method as in claim 6 wherein the semiconductor wafer is located on a wafer chuck in a reactor, in which Steps $c_1$) and $c_2$) include establishing a precursor vapor pressure in the range of approximately 30 to 50 torr (T), and in which Step d) includes establishing a reactor chamber pressure in the range of approximately 0.1 to 5 T.

8. A method as in claim 1 in which Step d) includes heating the wafer to a temperature in the range of approximately 480 to 550 degrees C.

9. A method as in claim 1 including a further step, preceding Step a), of:

depositing a conductive electrode, having a (111) orientation, overlying the semiconductor wafer, with the conductive electrode material being selected from the group consisting of iridium and platinum.

10. A method as in claim 1 in which Step e) includes epitaxially growing $Pb_5Ge_3O_{11}$ phase to have a c-axis crystallographic orientation, whereby the ferroelectric properties of PGO film are improved.

11. A method as in claim 10 in which Step e) includes the epitaxially growing the $Pb_5Ge_3O_{11}$ phase to have more than 99% of the crystals in the c-axis crystallographic orientation.

12. A method as in claim 1 including a further step, following Step e), of:

f) annealing the PGO film formed in Step e) at a temperature in the range of approximately 500 to 550 degrees C. in an atmosphere selected from the group of oxygen and oxygen with Pb atmospheres, whereby the c-axis orientation of the PGO film is enhanced.

13. A method as in claim 12 wherein a conductive electrode underlies the PGO film, and including further steps following Step f) of:

g) forming a conductive electrode having a (111) orientation overlying the PGO film formed in Step e); and h) annealing the PGO film formed in Step e) at a temperature in the range of approximately 500 to 550 degrees C. in an atmosphere selected from the group of oxygen and oxygen with Pb atmospheres, whereby the interface between the PGO film, formed in Step e), and the electrode formed in Step g), is improved.

14. A method as in claim 13 in which Steps f) and h) include the oxygen being introduced at a partial pressure in the range of approximately 20 to 100%.

15. A method as in claim 13 in which Steps f) and h) include using an annealing method selected from the group consisting of furnace annealing and rapid thermal annealing (RTA) at a thermal ramp-up rate in the range of approximately 10 to 200 degrees C. per seconds, and a time duration of approximately 10 minutes.

16. A method as in claim 1 in which Step e) includes epitaxially growing a second phase $Pb_3GeO_5$ having a phase range of approximately 0 to 5%.

17. A method as in claim 1 wherein a high speed rotational system is provided, and in which Step e) includes controlling the speed of rotation to be in the range between 600 and 1000 rpm, whereby the homogeneity of the PGO film is enhanced.

* * * * *